(12) United States Patent
Bellof et al.

(10) Patent No.: US 9,893,698 B2
(45) Date of Patent: Feb. 13, 2018

(54) METHOD AND APPARATUS FOR PROCESSING AUDIO SIGNALS TO ADJUST PSYCHOACOUSTIC LOUDNESS

(71) Applicant: FORD GLOBAL TECHNOLOGIES, LLC, Dearborn, MI (US)

(72) Inventors: Marco Bellof, Aachen (DE); Bjoern Jacobs, Euskirchen (DE)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/265,227

(22) Filed: Sep. 14, 2016

(65) Prior Publication Data

US 2017/0077889 A1    Mar. 16, 2017

(30) Foreign Application Priority Data

Sep. 15, 2015  (DE) .......................... 10 2015 217 565

(51) Int. Cl.
| | | |
|---|---|---|
| *H03G 3/00* | (2006.01) | |
| *H03G 5/16* | (2006.01) | |
| *H03G 3/30* | (2006.01) | |
| *H03G 7/00* | (2006.01) | |

(52) U.S. Cl.
CPC ........... *H03G 5/165* (2013.01); *H03G 3/3005* (2013.01); *H03G 3/3089* (2013.01); *H03G 7/002* (2013.01); *H03G 7/007* (2013.01)

(58) Field of Classification Search
None
See application file for complete search history.

(56) References Cited

U.S. PATENT DOCUMENTS

| | | | | |
|---|---|---|---|---|
| 9,391,575 | B1* | 7/2016 | Yang | H03G 3/3005 |
| 2007/0121966 | A1* | 5/2007 | Plastina | H03G 7/007 |
| | | | | 381/104 |
| 2008/0025530 | A1* | 1/2008 | Romesburg | H03F 3/68 |
| | | | | 381/107 |
| 2008/0095385 | A1 | 4/2008 | Tourwe | |
| 2009/0271185 | A1 | 10/2009 | Smithers | |

(Continued)

FOREIGN PATENT DOCUMENTS

| | | |
|---|---|---|
| EP | 1763923 A1 | 3/2007 |
| EP | 1629463 B1 | 8/2007 |

(Continued)

OTHER PUBLICATIONS

German Examination Report for German Application No. 10 2015 217 565.0 dated Aug. 19, 2016.

(Continued)

*Primary Examiner* — Joseph Saunders, Jr.
*Assistant Examiner* — James Mooney
(74) *Attorney, Agent, or Firm* — Frank MacKenzie; Brooks Kushman P.C.

(57) ABSTRACT

A method and apparatus for processing audio signals in an entertainment system from at least one audio source modify audio signals during playback by the entertainment system for adjustment to a psychoacoustic loudness set value, wherein this modification is performed in each case on the basis of an average psychoacoustic loudness maximum determined over a predefined time interval for the audio source concerned.

18 Claims, 3 Drawing Sheets

(56) References Cited

U.S. PATENT DOCUMENTS

| | | | | |
|---|---|---|---|---|
| 2010/0046765 A1* | 2/2010 | De Bruijn | ............ | H03G 3/3005 |
| | | | | 381/58 |
| 2010/0067709 A1* | 3/2010 | Seefeldt | ................. | G10L 25/69 |
| | | | | 381/56 |
| 2014/0016791 A1 | 1/2014 | Smith et al. | | |
| 2015/0036842 A1* | 2/2015 | Robinson | ................ | G06F 3/165 |
| | | | | 381/103 |

FOREIGN PATENT DOCUMENTS

| | | |
|---|---|---|
| EP | 1835487 A2 | 9/2007 |
| EP | 1805891 B1 | 5/2012 |
| WO | 2004111994 A2 | 12/2004 |
| WO | 2008078232 A1 | 7/2008 |
| WO | 2013154823 A2 | 10/2013 |

OTHER PUBLICATIONS

European Search Report for European Application No. EP 16184883 dated May 31, 2017.

* cited by examiner

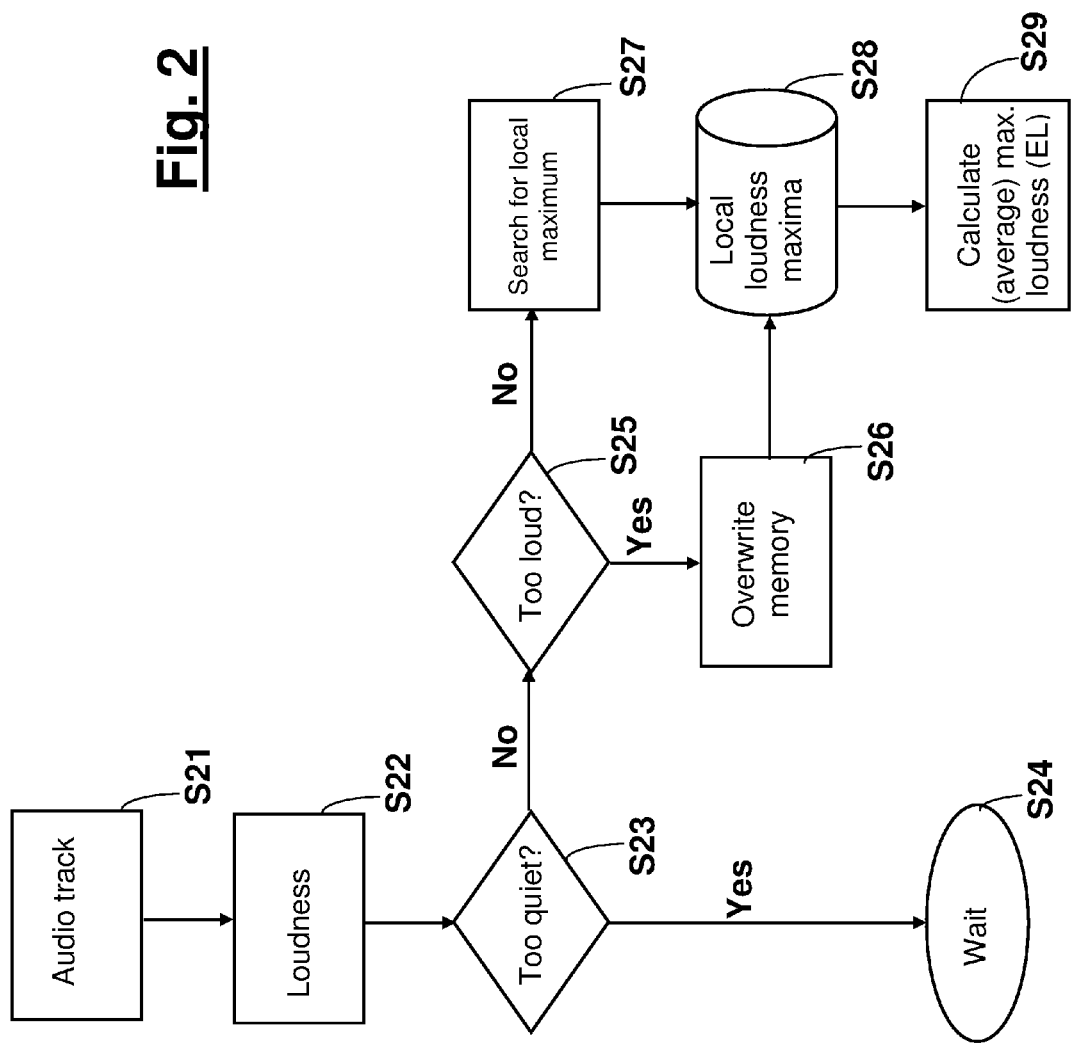

METHOD AND APPARATUS FOR PROCESSING AUDIO SIGNALS TO ADJUST PSYCHOACOUSTIC LOUDNESS

CROSS-REFERENCE TO RELATED APPLICATIONS

This application claims foreign priority benefits under 35 U.S.C. § 119(a)-(d) to DE 10 2015 217 565.0 filed Sep. 15, 2015, which is hereby incorporated by reference in its entirety.

TECHNICAL FIELD

The disclosure relates to a method and an apparatus for processing audio signals in an entertainment system.

BACKGROUND

Entertainment systems currently use a variety of different audio sources. Here, each audio source typically has a specific volume level which is predefined by the respective hardware, the software that is used, and the audio track concerned. After changing the audio source, the user is normally compelled to adjust or readjust the main volume in order to achieve the same, subjectively perceived, volume as previously. The perceived volume, which is known by the term "loudness", is dependent on the frequencies, amplitudes and temporal position of the audio signals.

According to the online encyclopedia Wikipedia, loudness is a quantity for the proportional mapping of human volume perception (cf. http://www.wikipedia.de under the heading "Lautheit" ["Loudness"], version dated Aug. 3, 2015).

Loudness is a psychoacoustic term which describes how a number of test persons predominantly assess perceived volume. Loudness depends on the sound pressure level, the frequency spectrum and the behavior over time of the sound. The perception of loudness is caused by the type and manner of the sound processing in the inner ear. Depending on the strength of the excitation of the nerve cells, a noise is assessed as louder or quieter. Loudness will generally be twice as great when the sound is perceived as twice as loud.

Standardized measuring methods are known for the quantitative determination of loudness. However, the term "loudness" used in the context of the present disclosure is generally intended to be understood as a psychoacoustically weighted volume which may correspond to loudness (measured in sones) defined according to standardized measuring methods, but can also be defined by means of alternative (where appropriate simplified) methods.

Algorithms are known which adjust the volume of audio signals during real-time processing. However, these algorithms change the sound track concerned using equalizers, compressors or limiters, or they reduce the dynamic range as a result of the adjustment. In addition, algorithms of this type frequently require a high processing and storage capacity.

SUMMARY

In one embodiment of a method for processing audio signals in an entertainment system, audio signals from at least one audio source are modified during playback by the entertainment system for adjustment to a psychoacoustic loudness set value, wherein this modification is performed in each case on the basis of an average psychoacoustic loudness maximum determined over a predefined time interval for the audio source concerned.

According to one embodiment, audio signals from at least two different audio sources are modified during playback by the entertainment system for adjustment to a psychoacoustic loudness set value.

The embodiments are based, in particular, on the concept of performing a real-time adjustment of different audio sources to a psychoacoustic loudness set value. In another embodiment, a method is based, in particular, on real-time data of the audio stream without the need for knowledge of future values. Furthermore, the audio signals from one or more audio sources are processed in each case with no dependency in each case on the audio signals from other audio sources.

The method according to various embodiments does not serve, for example, for volume adjustment of different pieces of music or songs which are played back from the same audio source. Instead, a dynamic adjustment of the audio signals from different audio sources of the entertainment system is performed in terms of the respective maximum, subjectively perceived loudness.

As already mentioned above, the term "loudness" represents a quantity approximately proportional to the volume psychoacoustically perceived by a user. This loudness can be calculated according to the relevant standards, but can also be defined by simplified approximations. In particular, the frequency weightings required for the loudness definition can be adjusted according to the special requirements in motor vehicles (e.g. by taking account of the typical background noise spectra).

According to one embodiment, the audio signals are multiplied in each case in the event of modification by an amplification depending on the respectively associated audio source.

According to one embodiment, this amplification is calculated in each case as the quotient of a loudness set value and the average psychoacoustic loudness maximum.

According to one embodiment, the estimation of the average maximum psychoacoustic loudness is performed on the basis of loudness data stored for the respective audio source.

The invention furthermore relates to an apparatus for processing audio signals, wherein audio signals from at least one audio source are modifiable during the playback by the entertainment system for adjustment to a psychoacoustic loudness set value, wherein the apparatus is configured to carry out a method with the features described above. With regard to advantages and advantageous designs of the apparatus, reference is made to the statements made above in connection with the method according to various embodiments.

The process of the disclosed embodiments is based, in particular, on long-term signal information. This is enabled by an extreme data reduction. Since a change in the amplification is made only very slowly in the normal case without a memory overwrite, the listener or user of the entertainment system is not able to perceive a dynamic volume or loudness change. Furthermore, as a result, the adjustment process is very stable and requires only comparatively low processing power.

The claimed subject matter is explained in detail below with reference to at least one representative embodiment and the attached drawings.

BRIEF DESCRIPTION OF THE DRAWINGS

FIG. 2 shows a flow diagram to explain an estimation of the maximum loudness performed using a method according to the disclosure;

DETAILED DESCRIPTION

As required, detailed embodiments are disclosed herein; however, it is to be understood that the disclosed embodiments are merely representative and may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the claimed subject matter.

Figure 1:
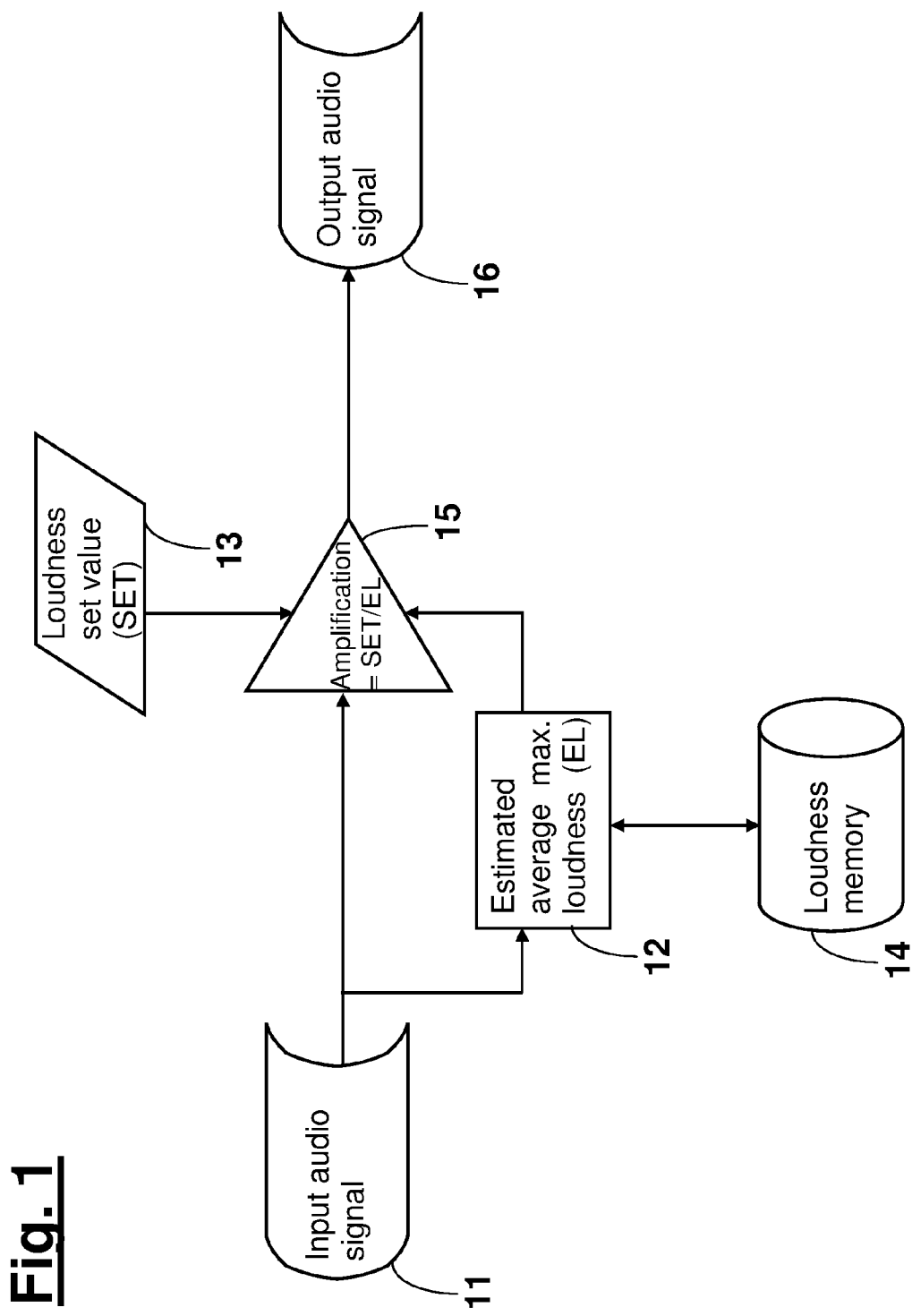
FIG. 1 shows a diagram to explain the method according to one embodiment for volume adjustment.

As shown in FIG. 1, in one embodiment of a method according to the disclosure for loudness adjustment, an input audio signal 11 is modified through multiplication by a source-dependent and time-dependent amplification 15 to obtain an output audio signal 16. The amplification 15 is calculated from a constant value by dividing a loudness set value (SET) 13 by the estimated average maximum psychoacoustic loudness 12 from a loudness memory 14 (as explained in more detail below with reference to FIG. 2). To avoid a signal distortion which could be caused by abrupt changes in the amplification 15, the amplification value may be weakened gradually over time.

The method according to various embodiments entails, in particular, an estimation of the average maximum of the psychoacoustic loudness for the purpose of calculating the amplification, wherein the process carried out for this estimation is described below with reference to the flow diagram from FIG. 2.

Here, the estimated average maximum loudness is referred to below as the EL value (EL="Estimated average maximum Loudness"). The EL value is calculated using volume data of the audio signal of the respective audio source available from the past.

To calculate the EL value, the current loudness is first measured depending on the signal frequency for a specific audio track (steps S21 and S22 in FIG. 2). The loudness values measured in this way are used to determine a local maximum within a fixed time interval. The respective current loudness maxima are stored in a memory, wherein values stored in this memory are overwritten in step S26 in each case according to the query S25 ("too loud?") if the respective existing EL value is exceeded by a defined tolerance. If the current loudness of the audio track is less than a predefined value, the adjustment is paused in step S23 ("too quiet?").

The data for storing a loudness characteristic of the audio track are obtained in each case according to step S28 on the basis of the search for a local maximum within a fixed time interval (step S27). The values present in the memory thus contain the respective loudness maxima of the audio signal of the audio source concerned. The EL value is calculated on the basis of the stored loudness maxima (step S29).

If no older volume values are available (e.g. because a new, unknown audio source is involved), or if the current volume is substantially greater than the EL value, a fast approximate determination of a new EL value is performed. This approximation is based on the new loudness maxima of the incoming audio track. As soon as a new average maximum is found, the memory content is overwritten with this value and the calculation is performed once more.

Figure 3:
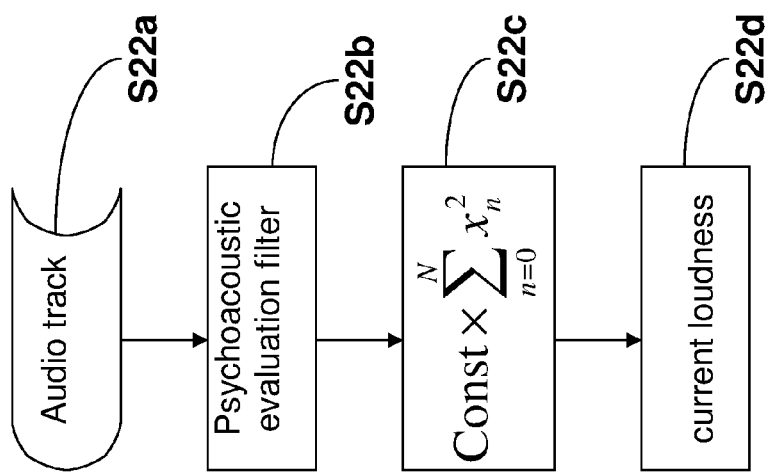
FIG. 3 shows a flow diagram to explain a possible implementation of the loudness definition according to step S22 from FIG. 2.

FIG. 3 shows an example of a schematic algorithm for a loudness definition in step S22 from FIG. 2. The audio track (S22a) is broken down into individual frequency components (e.g. by a Fourier analysis). A psychoacoustic evaluation filter, e.g. a bandpass filter, which may have the shape of a downwardly open parabola with a maximum at the perception maximum of the human ear, is applied to this discrete spectrum in step S22b. The square of the weighted spectral components obtained in this way is added and multiplied by a standardization constant in step S22c to produce a value which may be representative of the current loudness (S22d). Along with the loudness definition shown in FIG. 3, a variety of other algorithms are also conceivable for the loudness definition.

Figure 4:
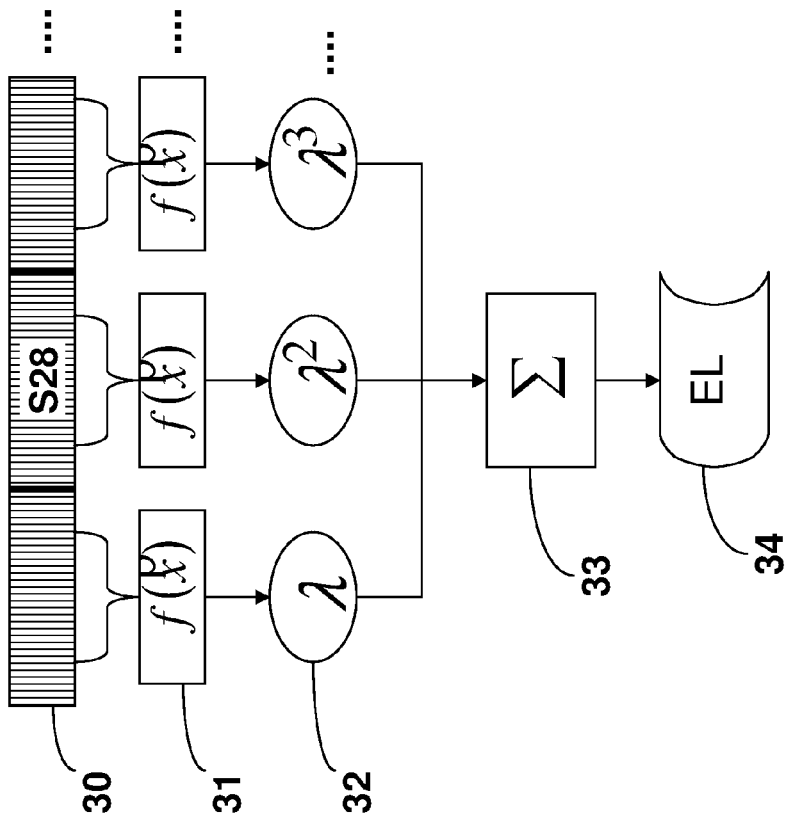
FIG. 4 shows a schematic representation of the calculation of the average maximum loudness according to step S29 from FIG. 2.

FIG. 4 shows a possible method, given merely by way of example, for determining the average maximum loudness as used in step S29 from FIG. 2. The audio signal present in the memory may be subdivided at 30 into individual blocks (in this case three). A function $f(\vec{x})$ which supplies a value close to the maximum (corresponds to step S28), for example $\max(\vec{x})$ and/or $\mathrm{mean}(\vec{x})+\mathrm{std}(\vec{x})$ and/or $\mathrm{mean}(\vec{y})$, is applied to the individual segments at 31, wherein $\vec{y}$ is intended to mean all values to which $x_i > \mathrm{mean}(\vec{x})$ applies (mean=average value, max=maximum and std=standard deviation). At 32, a "forgetting factor" $\lambda$ can optionally be applied to the individual values close to the maximum, wherein $0<\lambda<1$. As a result, the older signals are given less weighting than recent signals. Finally, the values obtained in this way are added at 33 to form a sum (if necessary following prior squaring) and the value EL is thus obtained at 34. In addition, a variety of other algorithms for determining the EL value are possible.

While representative embodiments are described above, it is not intended that these embodiments describe all possible forms of the claimed subject matter. The words used in the specification are words of description rather than limitation, and it is understood that various changes may be made without departing from the spirit and scope of the disclosure. Additionally, the features of various implementing embodiments may be combined to form further embodiments that may not be explicitly illustrated or described.

What is claimed is:

1. A method for processing audio signals from an audio source by an entertainment system, comprising:
    storing volume data of the audio signals in a memory;
    calculating an estimated average maximum loudness of the volume data over a plurality of time intervals by applying a mathematical function approximating a maximum to the audio signals associated with each of the plurality of time intervals to determine corresponding maximum estimates, applying a forgetting factor that varies based on elapsed time to each maximum estimate to generate time-weighted estimates, and summing the time-weighted estimates to determine the estimated average maximum loudness;
    storing the estimated average maximum loudness in the memory; and amplifying the audio signals during playback by the entertainment system based on the estimated average maximum loudness and a psychoacoustic loudness set value.

2. The method of claim 1 wherein amplifying the audio signals comprises amplifying the audio signals by a ratio of the psychoacoustic loudness set value to the estimated average maximum loudness.

3. The method of claim 1 wherein calculating an estimated average maximum loudness comprises:
measuring loudness of each of a plurality of frequency bands of the audio signals;
identifying a local maximum loudness within a fixed time interval for each of the plurality of frequency bands; and
storing the local maximum loudness for each of the frequency bands in the memory.

4. The method of claim 3 further comprising overwriting a previously stored local maximum loudness in the memory in response to a current local maximum loudness exceeding the previously stored local maximum loudness by a predetermined value.

5. The method of claim 1 further comprising:
separating the audio signals into a plurality of frequency components;
applying a bandpass filter to the frequency components to select a subset of the frequency components;
calculating a sum of the squares of each of the subset of filtered frequency components; and
multiplying the sum by a standardization constant to generate a current loudness value.

6. The method of claim 1 wherein the mathematical function comprises a sum of an average and standard deviation of the volume of the audio signals over the time interval.

7. The method of claim 1 wherein the audio signals originate from at least two different audio sources.

8. The method of claim 1 wherein the storing volume data, calculating an estimated average maximum loudness, and storing the estimated average maximum loudness are performed for at least two different audio sources with the estimated average maximum loudness associated with each of the at least two different audio sources.

9. The method of claim 8 wherein amplifying the audio signals during playback comprises amplifying the audio signals based on a previously stored estimated average maximum loudness for a current audio source.

10. A system for processing audio signals from an audio source, comprising:
a memory; and
a processor programmed to:
store audio volume data of the audio signals in the memory; and
amplify the audio signals from the audio source during playback from the system based on a ratio of a loudness set value to an estimated average maximum loudness calculated by applying a mathematical function approximating a maximum to the audio signals associated with each of a plurality of time intervals to determine corresponding maximum estimates, applying a time-varying forgetting factor to each maximum estimate to generate time-weighted estimates, and summing the time-weighted estimates to determine the estimated average maximum loudness over the plurality of time intervals based on the audio volume data.

11. The system of claim 10 wherein the processor is further programmed to calculate the estimated average maximum loudness by:
measuring loudness of each of a plurality of frequency bands of the audio signals;
identifying a local maximum loudness within a fixed time interval for each of the plurality of frequency bands; and
storing the local maximum loudness for each of the frequency bands in the memory.

12. The system of claim 10 wherein the processor is further programmed to:
apply a bandpass filter to frequency components of the audio signals to select subsets of the frequency components based on human hearing perception;
calculate a sum of the squares of each of the subsets of filtered frequency components; and
multiply the sum by a constant to generate a current loudness value.

13. The system of claim 10 wherein the mathematical function comprises a sum of an average and standard deviation of the stored local maximum loudness values for each of the plurality of time intervals.

14. The system of claim 10 wherein the processor overwrites a previously stored estimated average maximum loudness in response to a current estimated average maximum loudness exceeding the previously stored loudness by a predetermined amount.

15. A method for processing audio signals by an entertainment system, comprising:
amplifying the audio signals during playback based on a loudness set value and an estimated average maximum loudness value calculated during each of a plurality of fixed time intervals by applying a mathematical function to determine estimated maximums, applying a time-varying forgetting factor to the estimated maximums to generate time-weighted estimates, and summing the time-weighted estimates to determine the estimated average maximum loudness.

16. The method of claim 15 further comprising amplifying the audio signals by multiplying the audio signals by the loudness set value divided by the estimated maximum loudness value.

17. The method of claim 15 further comprising storing the estimated average maximum loudness value for each of a plurality of audio sources.

18. The method of claim 15 further comprising:
filtering frequency components of the audio signals to select frequencies associated with human hearing perception; and
calculating a sum of squares of each of the selected frequencies to generate a current loudness value.

* * * * *